(12) United States Patent
Mallick et al.

(10) Patent No.: US 7,498,273 B2
(45) Date of Patent: Mar. 3, 2009

(54) FORMATION OF HIGH QUALITY DIELECTRIC FILMS OF SILICON DIOXIDE FOR STI: USAGE OF DIFFERENT SILOXANE-BASED PRECURSORS FOR HARP II—REMOTE PLASMA ENHANCED DEPOSITION PROCESSES

(75) Inventors: Abhijit Basu Mallick, Palo Alto, CA (US); Jeffrey C. Munro, Santa Clara, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 59 days.

(21) Appl. No.: 11/549,930

(22) Filed: Oct. 16, 2006

(65) Prior Publication Data

US 2007/0281495 A1    Dec. 6, 2007

Related U.S. Application Data

(60) Provisional application No. 60/805,573, filed on Jun. 22, 2006, provisional application No. 60/803,493, filed on May 30, 2006, provisional application No. 60/803,489, filed on May 30, 2006, provisional application No. 60/803,481, filed on May 30, 2006.

(51) Int. Cl.
*H01L 21/00* (2006.01)
(52) U.S. Cl. ............ 438/931; 438/753; 257/E21.17; 257/E21.277; 257/E21.278; 257/E21.311; 257/E21.304
(58) Field of Classification Search ............ 438/931, 438/308, 513, 680, 692, 723, 743, 756, 753, 438/903, 474
See application file for complete search history.

(56) References Cited

U.S. PATENT DOCUMENTS 4,147,571 A    4/1979    Stringfellow et al.

(Continued)

FOREIGN PATENT DOCUMENTS

DE    19654737 A1    7/1997

(Continued)

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

(Continued)

*Primary Examiner*—David Nhu
(74) *Attorney, Agent, or Firm*—Townsend and Townsend and Crew

(57) ABSTRACT

Methods of depositing a dielectric layer in a gap formed on a substrate are described. The methods include introducing an organo-silicon precursor and an oxygen precursor to a deposition chamber. The organo-silicon precursor has a C:Si atom ratio of less than 8, and the oxygen precursor comprises atomic oxygen that is generated outside the deposition chamber. The precursors are reacted to form the dielectric layer in the gap. Methods of filling gaps with dielectric materials are also described. These methods include providing an organo-silicon precursor having a C:Si atom ratio of less than 8 and an oxygen precursor, and generating a plasma from the precursors to deposit a first portion of the dielectric material in the gap. The dielectric material may be etched, and a second portion of dielectric material may be formed in the gap. The first and second portions of the dielectric material may be annealed.

37 Claims, 8 Drawing Sheets

U.S. PATENT DOCUMENTS

| | | | |
|---|---|---|---|
| 5,016,332 | A | 5/1991 | Reichelderfer et al. |
| 5,426,076 | A | 6/1995 | Moghadam |
| 5,558,717 | A * | 9/1996 | Zhao et al. .................. 118/715 |
| 5,587,014 | A | 12/1996 | Lyechika et al. |
| 5,635,409 | A | 6/1997 | Moslehi |
| 5,937,308 | A | 8/1999 | Gardner et al. |
| 6,009,830 | A | 1/2000 | Li et al. |
| 6,024,044 | A | 2/2000 | Law et al. |
| 6,090,723 | A | 7/2000 | Thakur et al. |
| 6,156,581 | A | 12/2000 | Vaudo et al. |
| 6,302,964 | B1 | 10/2001 | Umotoy et al. |
| 6,383,954 | B1 | 5/2002 | Wang et al. |
| 6,387,207 | B1 * | 5/2002 | Janakiraman et al. .. 156/345.35 |
| 6,406,677 | B1 | 6/2002 | Carter et al. |
| 6,508,879 | B1 | 1/2003 | Hashimoto |
| 6,509,283 | B1 | 1/2003 | Thomas |
| 6,528,332 | B2 | 3/2003 | Mahanpour et al. |
| 6,548,416 | B2 | 4/2003 | Han et al. |
| 6,614,181 | B1 * | 9/2003 | Harvey et al. ................ 313/567 |
| 6,660,391 | B1 | 12/2003 | Rose et al. |
| 6,676,751 | B2 | 1/2004 | Solomon et al. |
| 6,756,085 | B2 | 6/2004 | Waldfried et al. |
| 6,794,290 | B1 | 9/2004 | Papasouliotis et al. |
| 6,830,624 | B2 | 12/2004 | Janakiraman et al. |
| 6,833,052 | B2 | 12/2004 | Li et al. |
| 6,867,086 | B1 | 3/2005 | Chen et al. |
| 6,890,403 | B2 | 5/2005 | Cheung |
| 6,900,067 | B2 | 5/2005 | Kobayashi et al. |
| 6,958,112 | B2 * | 10/2005 | Karim et al. ............. 204/192.3 |
| 7,018,902 | B2 | 3/2006 | Visokay et al. |
| 2001/0021595 | A1 | 9/2001 | Jang et al. |
| 2001/0054387 | A1 | 12/2001 | Frankel et al. |
| 2002/0127350 | A1 | 9/2002 | Ishikawa et al. |
| 2003/0064154 | A1 | 4/2003 | Laxman et al. |
| 2003/0159656 | A1 * | 8/2003 | Tan et al. ............... 118/723.001 |
| 2003/0172872 | A1 | 9/2003 | Thakur et al. |
| 2004/0048492 | A1 | 3/2004 | Ishikawa et al. |
| 2004/0065253 | A1 | 4/2004 | Pois et al. |
| 2004/0079118 | A1 | 4/2004 | M'Saad et al. |
| 2004/0146661 | A1 * | 7/2004 | Kapoor et al. ............... 427/569 |
| 2004/0161899 | A1 | 8/2004 | Luo et al. |
| 2004/0175501 | A1 | 9/2004 | Lukas et al. |
| 2005/0001556 | A1 | 1/2005 | Hoffman et al. |
| 2005/0250340 | A1 | 11/2005 | Chen et al. |
| 2006/0011984 | A1 | 1/2006 | Curie |
| 2006/0121394 | A1 | 6/2006 | Chi |
| 2007/0128864 | A1 | 6/2007 | Ma et al |

FOREIGN PATENT DOCUMENTS

| | | |
|---|---|---|
| EP | 1717848 A | 11/2006 |
| WO | WO 03/066933 A | 8/2003 |
| WO | WO 2005/078784 A | 8/2005 |
| WO | WO 2007/140376 A | 12/2007 |
| WO | WO 2007/140424 A | 12/2007 |

OTHER PUBLICATIONS

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec., 2006, p. 14.

PCT International Search Report and Written Opinion mailed Jul. 30, 2008 by the European Patent Office, International Application No. PCT/US2007/081139, 19 pages.

* cited by examiner

US 7,498,273 B2

FORMATION OF HIGH QUALITY DIELECTRIC FILMS OF SILICON DIOXIDE FOR STI: USAGE OF DIFFERENT SILOXANE-BASED PRECURSORS FOR HARP II—REMOTE PLASMA ENHANCED DEPOSITION PROCESSES

CROSS-REFERENCES TO RELATED APPLICATIONS

This application is related to co-assigned U.S. Provisional Patent App. Ser. No. 60/803,493 to Ingle et al, filed May 30, 2006, and titled "CHEMICAL VAPOR DEPOSITION OF HIGH QUALITY FLOW-LIKE SILICON DIOXIDE USING A SILICON CONTAINING PRECURSOR AND ATOMIC OXYGEN." The application is also related to co-assigned U.S. Prov. Pat. App. Ser. No. 60/803,481 to Chen et al, filed May 30, 2006, and titled "A NOVEL DEPOSITION-PLASMA CURE CYCLE PROCESS TO ENHANCE FILM QUALITY OF SILICON DIOXIDE." The application is further related to co-assigned U.S. Prov. Pat. App. Ser. No. 60/803,489 to Munro et al, filed May 30, 2006, and titled "A METHOD FOR DEPOSITING AND CURING LOW-K FILMS FOR GAPFILL AND CONFORMAL FILM APPLICATIONS." The application is still further related to co-assigned U.S. Prov. Pat. App. Ser. No. 60/805,573 to Lubomirsky, filed Jun. 22, 2006, and titled "DIELECTRIC DEPOSITION AND ETCH BACK PROCESSES FOR BOTTOM UP GAP FILL." The entire contents of all four related applications is hereby incorporated by reference for all purposes.

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The smaller sizes, however, mean device elements have to work closer together which can increase the chances of electrical interference, including cross-talk and parasitic capacitance.

To reduce the degree of electrical interference, dielectric insulating materials are used to fill the gaps, trenches, and other spaces between the device elements, metal lines, and other device features. The dielectric materials are chosen for their ease of formation in the spaces between device features, and their low dielectric constants (i.e., "k-values"). Dielectrics with lower k-values are better at minimizing cross-talk and RC time delays, as well as reducing the overall power consumption of the device. Conventional dielectric materials include silicon oxide, which has an average k-value between 4.0 and 4.2 when deposited with conventional CVD techniques.

While the k-value of conventional CVD silicon oxide is acceptable for many device structures, the ever decreasing sizes and increasing densities of device elements have kept semiconductor manufacturers looking for dielectric materials with lower k-values. One approach has been to dope the silicon oxide with fluorine to make a fluorine-doped silicon oxide film (i.e., "FSG" film) with a dielectric constant as low as about 3.4 to 3.6. Another has been the development of spin-on glass techniques that coat the substrate with highly flowable precursors like hydrogen silsesquioxane (HSQ) to form a porous low-k film.

More recently, silicon-oxygen-carbon (Si—O—C) films have been developed with k-values of 3.0 or less. These low-k films are often deposited by the chemical vapor deposition of carbon-silicon and oxygen precursors on the substrate. While these Si—O—C films have lower k-values than pure and fluorine-doped silicon oxide films, they also tend to be substantially more porous, which can have negative consequences. Porous films are prone to increased absorption of water, which can increase the k-value of the film. Porous films also have higher "wet etch rate ratios" (WERRs) that can make the film more prone to corrosion and stress cracking. Thus, there is a need for new methods of depositing low-k carbon based films with reduced porosity, lower WERR values, and less cracking. These and other issues are addressed by embodiments of the invention.

BRIEF SUMMARY OF THE INVENTION

Embodiments of the invention include methods of depositing a dielectric layer in a gap formed on a substrate. The methods may include the step of introducing an organo-silicon precursor and an oxygen precursor to a deposition chamber. The organo-silicon precursor may have a C:Si atom ratio of less than 8, and the oxygen precursor may include atomic oxygen generated outside the deposition chamber. The methods may also include reacting the precursors to form the dielectric layer in the gap.

Embodiments of the invention also include methods of filling a gap with a dielectric material. The methods may include the step of providing an organo-silicon precursor and an oxygen precursor to a deposition chamber, where the organo-silicon precursor has a C:Si atom ratio of less than 8. A plasma may be generated from the precursors in the deposition chamber, where the plasma deposits a first portion of the dielectric material in the gap. The methods may also include etching the first portion of the dielectric material to reduce the carbon content in the material, and depositing a second portion of the dielectric material in the gap. The first and second portions of the dielectric material in the gap may be annealed.

Embodiments of the invention still further include methods of depositing and annealing a dielectric material in a gap on a substrate. The methods may include the step of providing an organo-silicon precursor and an oxygen precursor to a deposition chamber, where the organo-silicon precursor has a C:Si atom ratio of less than 8. The precursors are reacted to deposit the dielectric material in the gap, and a thermal anneal may be performed on the deposited dielectric material. In addition, a plasma anneal may also be performed on the deposited dielectric material.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for depositing dielectric materials in gaps and on surfaces on a substrate. The dielectric materials may be formed from organo-silicon compounds that have a lower ratio of carbon atoms to silicon atoms (the C:Si ratio) than conventional tetraethoxysiloxane (TEOS). The dielectric films formed by combining these compounds with oxygen precursors typically have lower carbon contents, lower porosities, and lower WERRs than an initially deposited TEOS based silicon oxide. This makes the films less susceptible to cracking, void formation, water absorption, and/or shrinkage than TEOS based oxide films.

The organo-silicon compounds may also have a oxygen atom to silicon atom ratio (the O:Si ratio) that is equal to or greater than the TEOS O:Si ratio. Organo-silicon precursors with low C:Si ratios and high O:Si ratios produce higher quality silicon oxide films with lower carbon content than conventionally made oxides that exclusively use TEOS as a silicon precursor. Embodiments also include organo-silicon precursors that have one or more Si—O—Si linkages in the molecular structure. This linkage in the Si precursor facilitates the formation of $SiO_x$ films with reduced contamination from carbon and hydroxyl groups.

The organo-silicon compounds may also include halogenated siloxanes and silazoxanes that include halogen and nitrogen groups that can be easily oxidized into Si—O groups. The halogenated siloxanes may include chlorinated siloxanes such as octachlorotrisiloxane (OCTS) whose Si—C groups can be readily oxidized by molecular oxygen, ozone, nitrogen dioxide, hydrogen peroxide, etc., into Si—O groups with reduced carbon levels. Similarly, silazoxanes such as hexamethoxydisilazoxanes (HMDS-H) have Si—N groups that can be readily oxidized into Si—O groups.

The organo-silicon compounds may be introduced to reactive atomic oxygen precursors in the deposition chamber to further increase the formation of Si—O groups in the deposited dielectric film. The atomic oxygen may be initially generated outside the deposition chamber, using for example a remote high-density plasma generating unit, before being sent into the deposition chamber to react with the organo-silicon precursor. The resulting silicon oxide layer can have improved flowability and gap-flow characteristics, as well as lower carbon content and porosity, than conventional oxide films formed by reacting the organo-silicon precursor with molecular oxygen, ozone, etc., in the deposition chamber. Additional details about embodiments of the methods, products, and systems of the invention will now be discussed.

Exemplary Dielectric Deposition Methods

Figure 1:
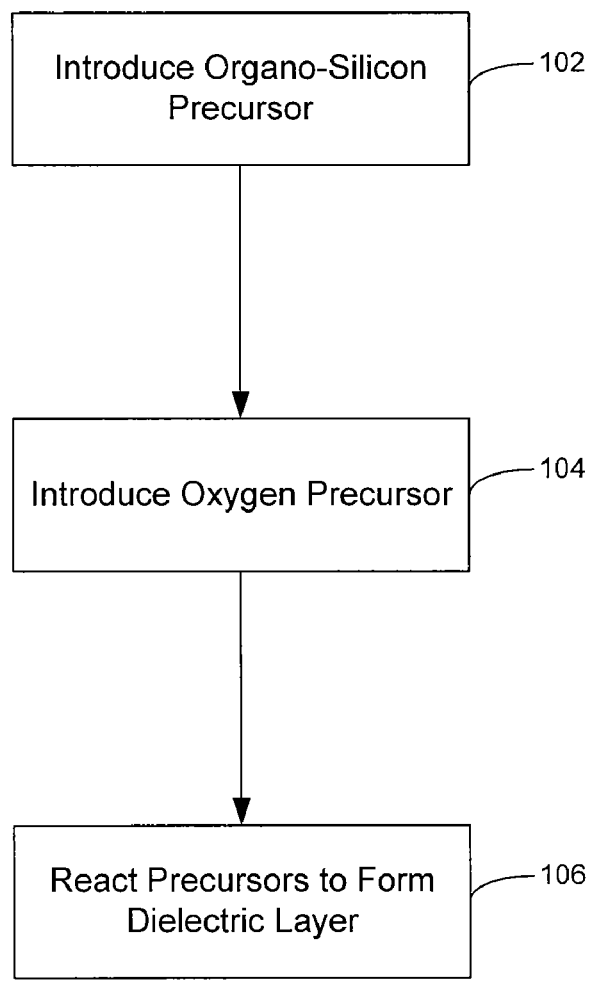
FIG. 1 is a flowchart showing a simplified overview of a dielectric deposition according to embodiments of the invention.

FIG. 1 shows a flowchart that includes a simplified overview of a dielectric deposition according to embodiments of the invention. The method 100 shown includes introducing an organo-silicon precursor 102 and an oxygen precursor 104 to a deposition chamber. The precursors react in the chamber to form a dielectric layer in the gaps and on the surfaces of the substrate 106.

The organo-silicon precursor introduced to the deposition chamber may have an C:Si atom ratio of less than 8 (e.g., a C:Si ratio of 7, 6, 5, 4, 3, 2, or 1 or less). This means there are fewer than 8 carbon atoms in the organo-silicon precursor molecule for every silicon atom present. By comparison, the tetraethoxysiloxane (TEOS) molecule shown below has 8 carbon atoms for every atom of silicon (i.e., a C:Si ratio of 8):

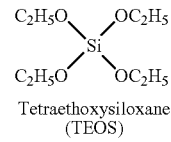

Tetraethoxysiloxane
(TEOS)

The organo-silicon precursor may be a siloxane compound such as triethoxysiloxane (TRIES), tetramethoxysiloxane (TMOS), trimethoxysiloxane (TRIMOS), hexamethoxydisiloxane (HMODS), octamethoxytrisiloxane (OMOTS), and/or octamethoxydodecasiloxane (OMODDS), among other siloxane compounds:

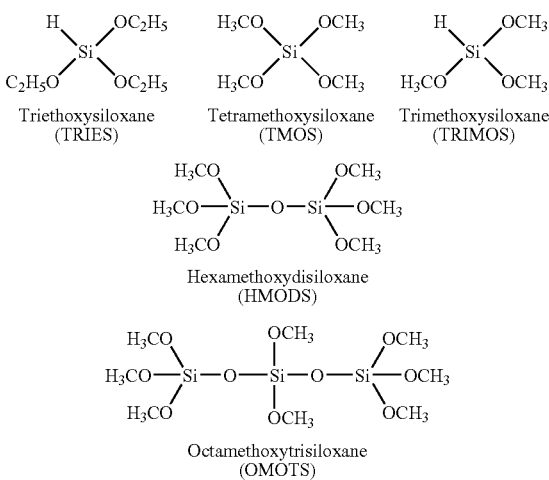

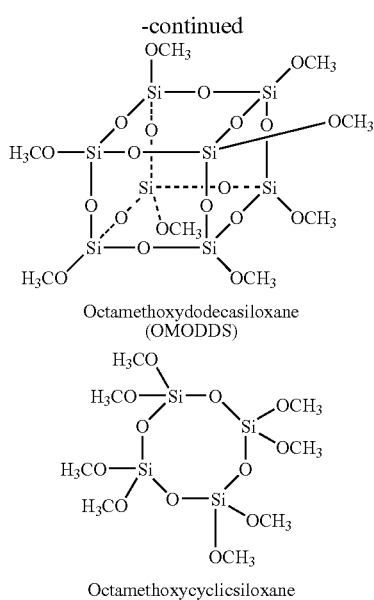

Octamethoxydodecasiloxane
(OMODDS)

Octamethoxycyclicsiloxane

The organo-silicon compound may also be a silazoxane compound that includes one or more nitrogen groups. The silazoxane compounds may include hexamethoxydisilazoxane (HMDS-H), methyl hexamethoxydisilazoxane (HMDS-CH$_3$), chlorohexamethoxydisilazoxane (HMDS-Cl), hexaethoxydislazoxane (HEDS-H), nonamethoxytrisilazoxane (NMTS), and octamethoxycyclicsilazoxane (OMCS), among other silazoxane compounds:

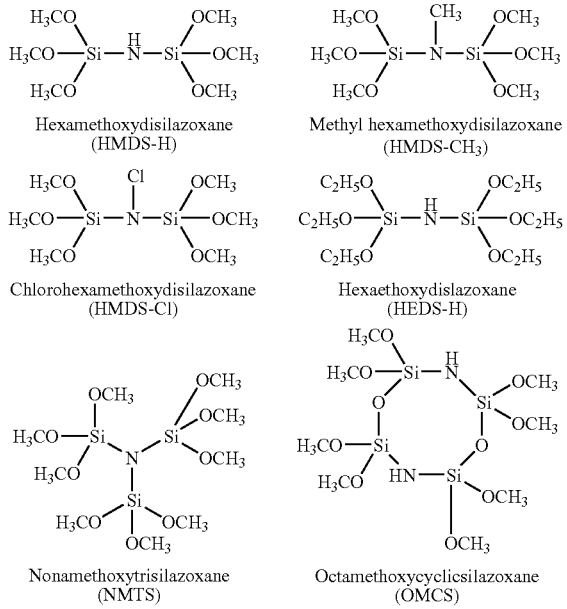

The organo-silicon compound further be a halogenated siloxane compound that includes one or more halogen groups (e.g., fluoride, chloride, bromide, or iodide groups). For example, the halogenated siloxane may be a chlorinated siloxane compound such as tetrachlorosilane (TECS), dichlorodiethoxysiloxane (DCDES), chlorotriethoxysiloxane (CTES), hexachlorodisiloxane (HCDS), and/or octachlorotrisiloxane (OCTS), among other chlorinated siloxane compounds:

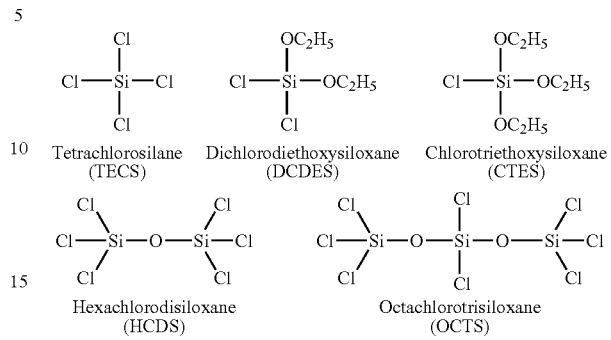

The organo-silicon compounds may also have an O:Si ratio of about 0, 0.5, 1, 2, 3, 4, 5, 6, etc., or more. For example, TMOS has an O:Si atom ratio of 4 (the same as TEOS). Other organo-silicon compounds, such as TRIES, and TRIMOS, have an O:Si ratio of 3. Still others, such as HCDS have an O:Si ratio of 0.5, and TECS has an O:Si ratio of 0.

The organo-silicon precursors may further include an Si—O—Si linkage, as seen in HMODS, OMOTS, OMODDS, HCDS, and OCTS, among other organo-silicon compounds. This linkage in the Si precursor may facilitate the formation of SiO$_x$ films with reduced contamination from carbon and hydroxyl groups.

The organo-silicon precursors may still further include aminosilanes such as Trisilylamine (TSA), Hexamethyldisilazane (HMDS), Silatrane, Tetrakis(dimethylamino)silane, Bis(diethylamino)silane, Tris(dimethylamino)chlorosilane, and methylsilatrane, among other compounds:

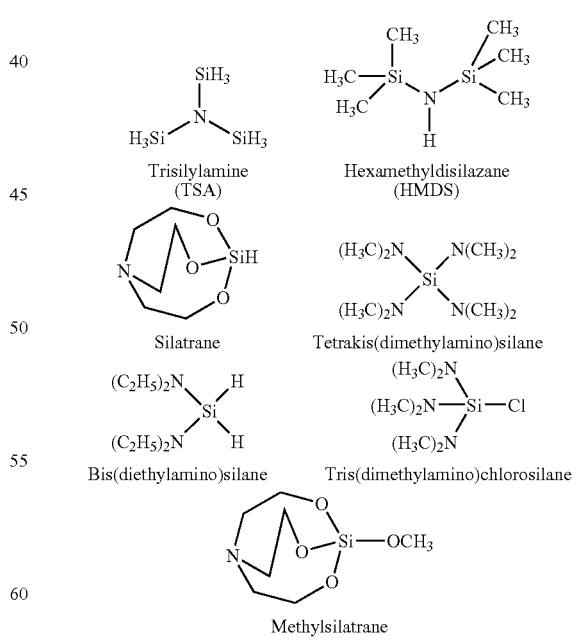

The organo-silicon precursors may still further include disilanes including, alkoxy disilanes, alkoxy-alkyl disilanes, and alkoxy-acetoxy disilanes. The alkoxy disilanes may include:

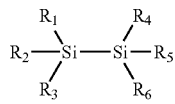

wherein $R_{1-6}$ may be, independently, a $C_{1-3}$ alkyloxy group. For example, the alkoxy disilanes may include hexamethoxydisilane, and hexaethoxydisilane among other alkoxy disilanes.

The alkoxy disilanes may also include cyclic disilane compounds with alkoxy groups bonded to the Si moieties. For example the alkoxycyclosilanes may include octaethoxycyclobutasilane, decabutaoxycyclopentasilane, and dodecamethoxycyclohexasilane, among others. Some examples of alkoxy disilanes are shown below:

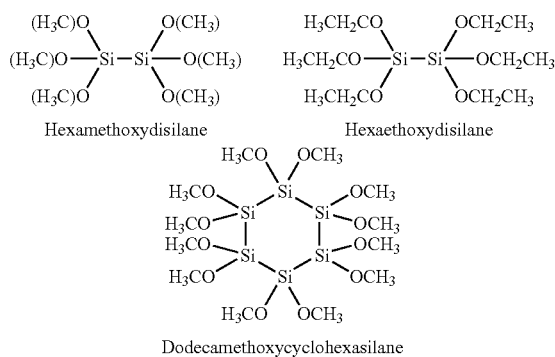

The alkoxy-alkyl disilanes may include:

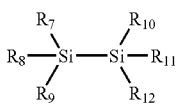

wherein $R_{7-12}$ may be, independently, a $C_{1-3}$ alkyl group or a $C_{1-3}$ alkyloxy group, and wherein at least one of $R_{7-12}$ is a alkyl group and at least one of $R_{7-12}$ is an alkyloxy group. Alkoxy-alkyl disilanes may also include cyclic disilanes with alkyl and alkoxy moieties, such as butasilanes, pentasilanes, hexasilanes, heptasilane, octasilanes, etc., having at least one alkyl and alkoxy group bonded thereto. Examples include octamethyl-1,4-dioxa-2,3,5,6-tetrasilacyclohexane; 1,4-dioxa-2,3,5,6-tetrasilacyclohexane; and 1,2,3,4,5,6-hexamethoxy-1,2,3,4,5,6,-hexamethylcyclohexasilane, among other alkoxy-alkyl cyclosilanes. Some examples of alkoxy-alkyl disilanes are shown below:

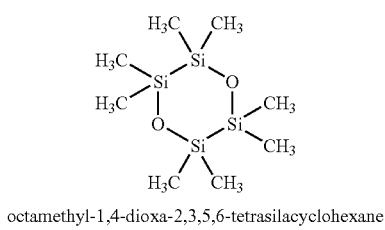

octamethyl-1,4-dioxa-2,3,5,6-tetrasilacyclohexane

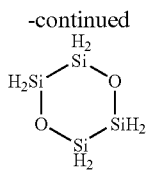

1,4-dioxa-2,3,5,6-tetrasilacyclohexane

1,1,2,2-tetraethoxy-1,2-dimethyldisilane

Alkoxy-acetoxy disilanes may include:

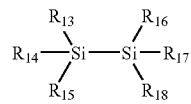

wherein $R_{13-17}$ may be, independently, a $C_{1-3}$ alkyl group, a $C_{1-3}$ alkoxy group, or an acetoxy group, and wherein at least one of $R_{13-17}$ is a alkoxy group and at least one of $R_{13-17}$ is an acetoxy group.

The organo-silicon precursors may yet further include organocyclosilanes such as cyclobutasilane, cyclopentasilane, cyclohexasilane, cycloheptasilane, cyclooctasilane, etc.

The oxygen precursor may include molecular oxygen ($O_2$), ozone ($O_3$), a nitrogen-oxygen compound (e.g., NO, $NO_2$, $N_2O$, etc.), a hydrogen-oxygen compound (e.g., $H_2O$, $H_2O_2$, etc.), as well as other oxygen containing precursors and combinations of precursors. In some embodiments, the oxygen precursor may include atomic oxygen radicals that are remotely generated and introduced into the deposition chamber with the organo-silicon precursor.

Figure 2:
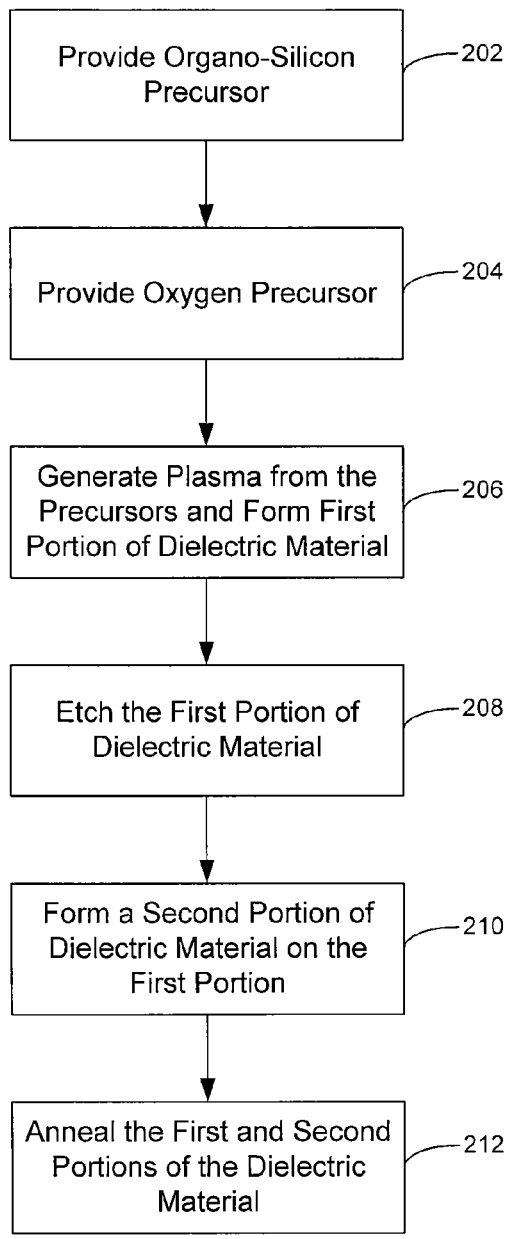
FIG. 2 is a flowchart illustrating methods of filling a gap with a dielectric material according to embodiments of the invention.

Referring now to FIG. 2, a flowchart illustrating a method 200 of filling a gap with a dielectric material according to embodiments of the invention is shown. The method 200 may include providing a substrate to a deposition chamber, and then introducing an organo-silicon precursor 202 and an oxygen precursor 204 to the chamber. The substrate may be a semiconductor wafer (e.g., a 200 mm, 300 mm, 400 mm, etc. silicon wafer) and may include structures, device components, etc., formed in earlier processes. For example, the substrate may include gaps, trenches, etc., with high height to width aspect ratios (e.g., an aspect ratio of 5:1 or more, 6:1 or more, 7:1 or more, 8:1 or more, 9:1 or more, 10:1 or more, 11:1 or more, 12:1 more, etc.). The where the dielectric material is deposited in the gap and other surfaces of the substrate.

As noted above, the organo-silicon precursor may include a siloxane, halogenated siloxane, and/or silazoxane compound, and may include organo-silicon compounds where the C:Si atom ratio of less than 8. The silicon precursor may be mixed with a carrier gas before or during its introduction to the deposition chamber. A carrier gas may be an inactive gas that does not unduly interfere with the formation of the oxide film on the substrate. Examples of carrier gases include helium, neon, argon, and hydrogen ($H_2$), among other gases.

For example, the organo-silicon precursor may be introduced to the deposition chamber by mixing an organo-silicon compound (gas or liquid) with helium at a flow rate of about 600 to about 2400 sccm through the room-temperature organo-silicon precursor to provide a flow of the precursor to the chamber at a rate of about 800 to about 1600 mgm.

The oxygen precursor may include molecular oxygen ($O_2$), ozone ($O_3$), a nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors. As described in more detail below for method 300, the oxygen precursor may also include atomic oxygen radicals that are remotely generated and introduced into the deposition chamber with the organo-silicon precursor.

The method 200 may include generating a plasma in the deposition chamber from the precursors, and forming a first portion of a dielectric material 206. In embodiments of method 200, the oxygen and organo-silicon precursors are not mixed before being introduced to the deposition chamber. The precursors may enter the chamber through separate spatially separated precursor inlets distributed around reaction chamber. For example, the oxygen precursor may enter from an inlet (or inlets) at the top of the chamber and positioned directly above the substrate. The inlet directs the flow of the oxygen precursor in a direction perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

As the oxygen and organo-silicon plasma reacts in the deposition chamber, it forms the first portion of a silicon oxide dielectric layer on the substrate deposition surface. The initial oxide layer has excellent flowability, and can quickly migrate into gaps, trenches, voids, seams, etc., in the structures present at the deposition surface. This allows the method 200 to provide oxide fills that are substantially free of voids and seams in gaps, trenches, and other surface structures that have high height to width aspect ratios (e.g., ARs of about 5:1, 6:1, 6:1, 8:1, 9:1, 10:1, 11:1, and 12:1 or more).

After the first portion of the dielectric material is formed, the flow of the precursors into the chamber may stop, and the material may be etched 208. The etching step may be used to dissociate and remove impurities in the material, and also to planarize the material. The etching process may include a single-step etch, or a multistep etch. A multistep etch process may include first etch may include using a lower-density plasma to dissociate larger organic molecules and remove at least a portion of the carbon in the dielectric material. This lower-density plasma etch may include using an RPS system to generate an $Ar/O_2$ plasma that etches the oxide layer. The etch conditions may include, for example, striking a plasma from a flow of 1600 sccm $O_2$ and 400 sccm argon at a power of about 5500 Watts and introducing it to the deposition chamber at a pressure of about 760 mTorr. This plasma etch can dissociate larger carbon groups and remove carbon impurities from the oxide layer.

Following this etch, a second etch of the oxide layer may be conducted at a higher plasma density to remove at least a portion of the hydroxyl groups in the layer. This higher-density plasma etch may include exposing the layer to a plasma formed from the dissociation of a flow of molecular oxygen (e.g., 600 sccm) with a high-power RF field (e.g., 6000 Watts). The oxygen plasma may be introduced to the deposition chamber at a pressure of, for example, 8 mTorr, and react with the —OH groups in the oxide layer to form silicon dioxide and water.

Following the etching of the first layer, the precursors are reintroduced to the deposition chamber, and react to form a second portion of dielectric material in the gap and other surfaces of the substrate 210. The second portion may also be an oxide layer formed under the same reaction conditions as the first layer, or may be formed under a different conditions (e.g., chamber pressure, temperature, organo-silicon precursor, etc.).

After the second layer has been formed it also may be etched to reduce impurity levels and/or planarize the layer. The second layer may be etched using the same process as used to etch the first layer, or may be etched using a different process, (e.g., different number of etching steps, different etch precursors, different power level, etc.).

Following the formation and treatment of the first and second portions of dielectric material (as well as any subsequent portions that may be deposited) the material may be annealed 212 to form a uniform, high-quality silicon oxide gapfill. The final gapfill may have a dielectric constant (i.e., k-value) of less than 3.0, and a wet-etch rate ratio (WERR) of less than 2:1 (e.g., about 1.8:1 to about 1.4:1). The gapfill may be uniform throughout the fill volume, and contain few, if any, voids or seams.

Figure 3:
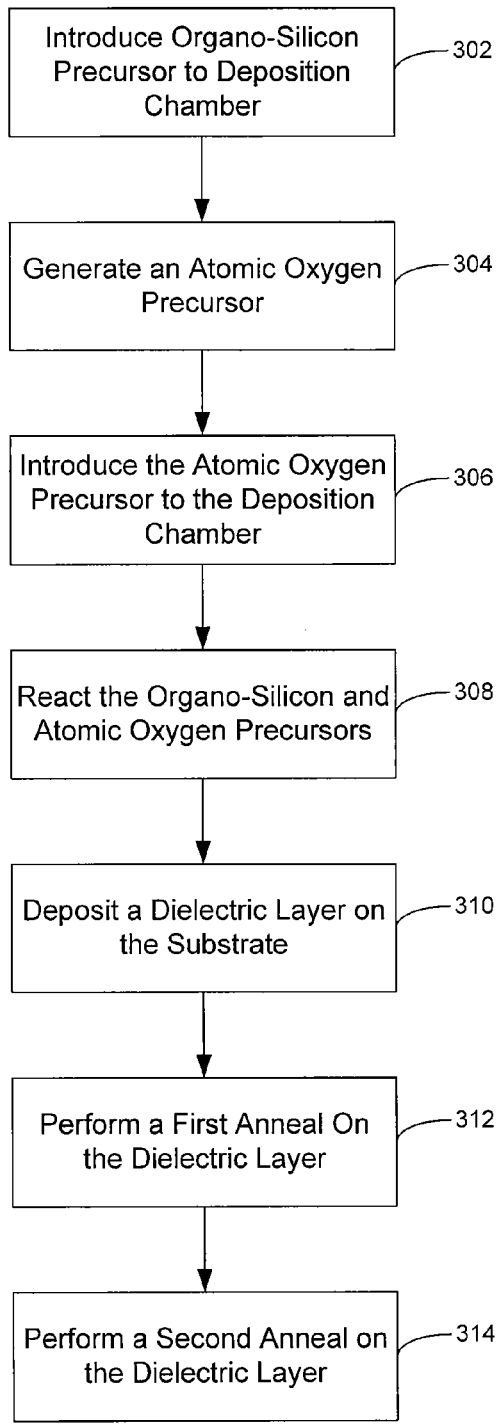
FIG. 3 is a flowchart showing steps for depositing and annealing a dielectric material in a gap on a substrate according to embodiments of the invention.

FIG. 3 is a flowchart showing steps for depositing and annealing a dielectric material in a gap on a substrate according to additional embodiments of the invention. The method 300 includes introducing the organo-silicon precursor to the deposition chamber 302. The method 300 also includes generating a highly reactive atomic oxygen precursor 304 by the dissociation of an oxygen containing precursor such as molecular oxygen ($O_2$), ozone ($O_3$), an nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The oxygen containing precursor may be dissociated remotely to make the atomic oxygen. The dissociation process may include thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor. For example, the atomic oxygen may be generated in a remote high-density plasma generator supplying 4000 to 6000 Watts (e.g., 5500 Watts) of RF power to a combined gas stream of argon gas flowing at, for example, about 900 to 1800 sccm with molecular oxygen ($O_2$) flowing at, for example, about 600 to about 1200 sccm.

The reactive atomic oxygen plasma is then introduced to the deposition chamber 306, where it may mix for the first time with the organo-silicon precursor, which is also introduced to the chamber. The highly reactive atomic oxygen will react with the silicon precursor 308 (and other deposition precursors that may be present in the reaction chamber) at moderate temperatures (e.g., reaction temperatures less than 100° C.) and pressures (e.g., 0.5 to 6 Torr total chamber pressure).

Embodiments include sending the atomic oxygen and silicon precursors through separate ports of a multi-port showerhead. For example, a showerhead positioned above the substrate may include a pattern of openings for the precursors to enter the deposition chamber. One subset of openings may be supplied by the atomic oxygen precursor, while a second subset of openings is supplied by the silicon precursor. Precursors traveling through different sets of opening may be fluidly isolated from each other until exiting into the deposition chamber. Additional details about types and designs of precursor handling equipment is described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which are hereby incorporated by reference for all purposes.

As the precursors react with one another in the chamber, the dielectric layer is deposited on the substrate 310. The total pressure in the chamber during the deposition may be, for example, about 0.5 Torr to about 6 Torr. Higher total pressures (e.g., 1.3 Torr) may deposit a oxide film with more flow-like qualities, while lower pressures (e.g., 0.5 Torr) may deposit a more conformal oxide layer. The deposition temperature in the reaction chamber may be relatively low (e.g., about 100° C. or less). The deposition rates may range from about 500 Å/min to about 3000 Å/min (e.g., 1500 Å/min). The thickness of the layer may be about 50 Å to about 500 Å (e.g., about 100 Å to about 200 Å).

Following the deposition of the dielectric layer a first anneal may be performed 312 that removes a portion of the moisture and increases the hardness of the layer. This initial anneal step may include heating the oxide layer for about 1 minute to 10 minutes in an inert environment (e.g., a dry-$N_2$ environment). A thermal anneal temperature may be selected that will not damage metal lines formed in the substrate structure, such as when the oxide layer is an intermetal dielectric being deposited over an aluminum metal lines.

Alternatively (or in addition) the first anneal step may include exposing the silicon oxide layer to ultra-violet (UV) light for about 1 minute to about 30 minutes. Like the thermal anneal, a UV anneal may remove a portion of the moisture present in the initially deposited oxide film, and also increase the hardness of the film.

After termination of the first anneal, a second anneal step may be performed 314 to further remove moisture and silanol bonds from the oxide layer. In this anneal step 314, substantially all of the moisture and silanol may be removed to give the layer a lower k-value and lower WERR value than either the initially deposited oxide or after the layer was treated in the first anneal step. This second anneal may include exposing the oxide layer to a plasma that is efficient at removing water and silanol groups from the dielectric oxide. Following the first anneal, however, the oxide layer has sufficient hardness to reduce (or prevent) the plasma from disrupting the carbon groups present in the oxide. Thus, for low-k, carbon containing oxide layers, the plasma anneal does not remove enough carbon to increase significantly the k-value of the layer.

Figure 4:
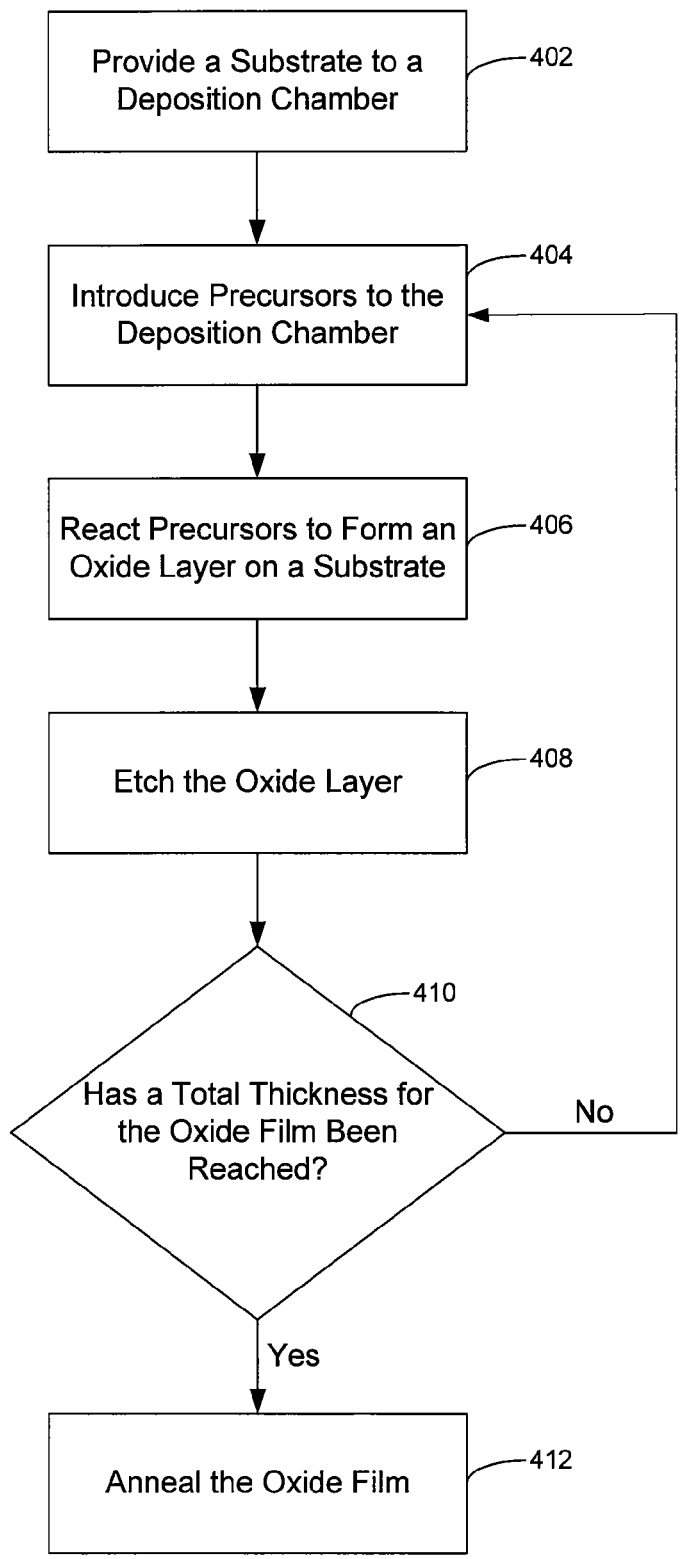
FIG. 4 is a flowchart illustrating methods of making a multilayer silicon oxide film according to embodiments of the invention.

Referring now to FIG. 4, another flowchart illustrating a method 400 of making a multilayer silicon oxide film according to embodiments of the invention is shown. The method 400 includes providing a substrate to a deposition chamber 402 and introducing precursors (e.g., atomic oxygen and organo-silicon precursors) to the chamber 404. The precursors react to form a silicon oxide layer on the substrate 406, and then the oxide layer may be etched 408.

At this point, a check may be made to determine if the cumulative thickness of the deposited oxide layers has reached a preset point 410. If the preset thickness level of the total oxide film has been reached, then the deposition and etch cycle may end, and the film may be annealed 412. However, if the thickness level has not been met, then another oxide deposition and etch cycle may occur to add at least one more additional layer to the oxide film.

Determining whether the oxide film has reached a predetermined thickness may be done by a thickness measurement of the deposited and etched layers, or may be done by calculating the number of layers need to reach a desired film thickness. For example, if each deposited and etched layer is 100 Å thick, and the desired film thickness 1.2 µm, then 12 deposition and etch cycles should be done to form the film.

The thickness of each deposited layer may be set by controlling the parameters that effect the oxide deposition rate, such as the types and flow rates of the reactive precursors, the total pressure in the deposition chamber, and the temperature, among other parameters. As noted above, typical deposition rates for the oxide layers are about 500 Å/min to about 3000 Å/min (e.g., about 1500 Å/min).

Figure 5A:
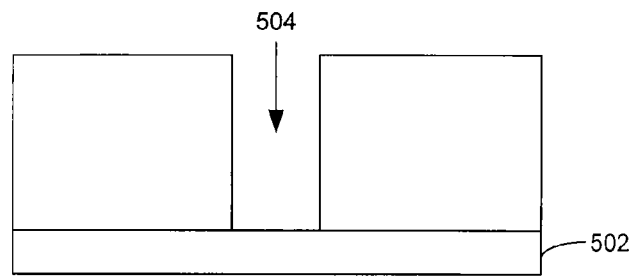
FIGS. 5A-5F show a substrate having a gap structure that is progressively filled with a multilayer silicon oxide film according to embodiments of the invention.

FIGS. 5A-5F show a substrate having a gap structure that is progressively filled with a multilayer silicon oxide film using embodiments of the multicycle deposition-etch oxide layer formation process. FIG. 5A shows a substrate 502 on which a gap 504 has been formed. It will be appreciated that gap 504 shown in FIGS. 5A-F has been drawn with a relatively low aspect ratio to more clearly show the progression of the oxide fill layers. Embodiments of the present gapfill methods may include void and seam free depositions into gaps having aspect ratios of 5:1, 6:1, 7:1, 8:1, 9:1, 10:1, 11:1, 12:1, 13:1, 14:1, and 15:1 or more.

Figure 5B:
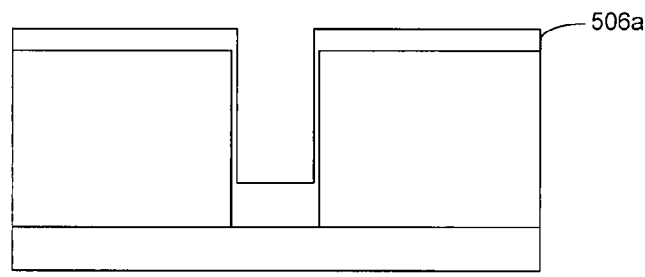

FIG. 5B shows a first oxide layer 506a deposited in gap 504. The silicon oxide that formed the layer has good flowability qualities, allowing the film to quickly migrate to the bottom of gap 504. Thus, the thickness of the deposited oxide at the bottom of the gap 504 may be greater than the oxide thickness along the sidewalls of the gap.

Figure 5C:
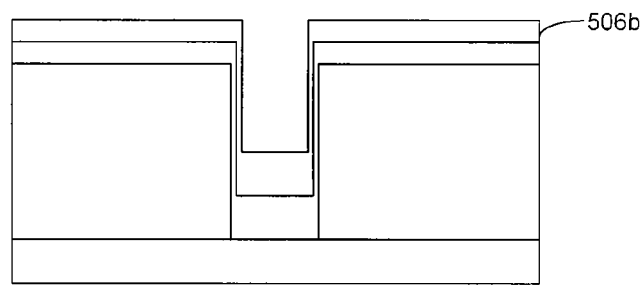
Figure 5D:
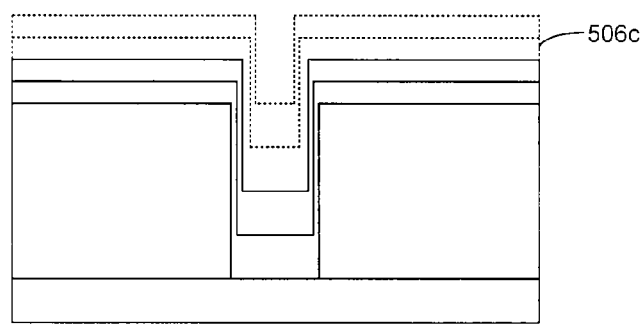

FIGS. 5C and 5D show additional oxide layers 506b, 506c, etc., being deposited on previously deposited and etched layers in the gap 504. These additional layers may be formed from the bottom up in the gap 504, until a desired oxide film thickness level is reached (e.g., the top of gap 504).

Figure 5E:
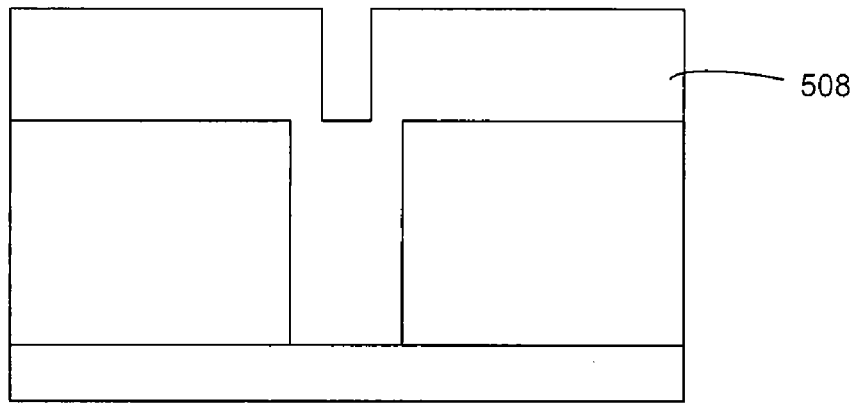
Figure 5F:
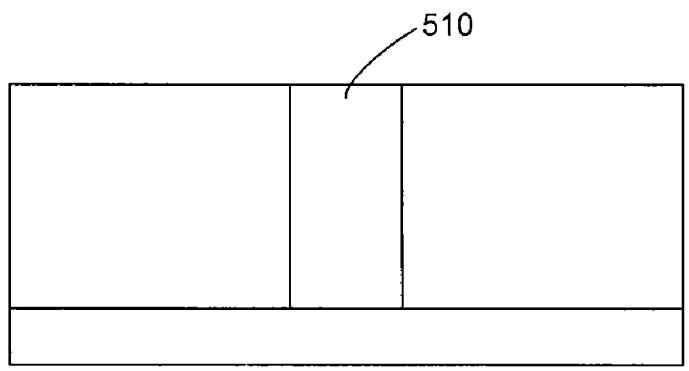

Once the last of the plurality of the oxide layers is deposited and etched, an anneal may be conducted to form the layers into a uniform film 508, as shown in FIG. 5E. The film may be planarized by, for example, plasma etching or CMP to remove deposition materials formed over the top of the gap 504. FIG. 5F shows the remaining silicon oxide gapfill 510, having few, if any, voids or seams, and having high film-quality and dielectric characteristics.

Exemplary Substrate Processing System

Deposition systems that may implement embodiments of the present invention may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems, available from Applied Materials, Inc. of Santa Clara, Calif.

Examples of substrate processing systems that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 6A:
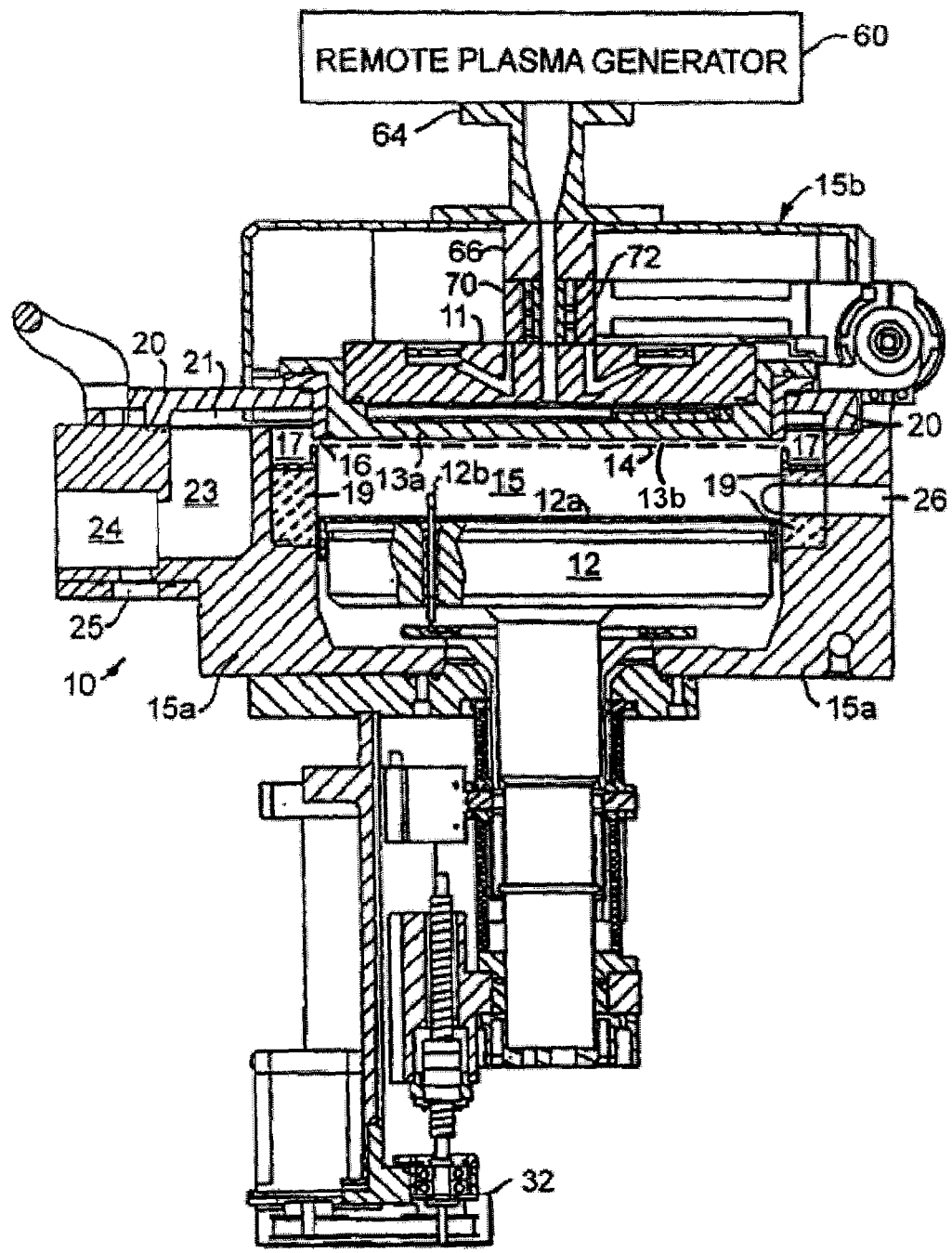
FIG. 6A shows a vertical cross-sectional view of a substrate processing system that may be used to form silicon oxide layers according to embodiments of the invention.

Referring now to FIG. 6A, vertical cross-sectional views of a CVD system 10 is shown that has a vacuum or processing chamber 15 that includes a chamber wall 15a and a chamber lid assembly 15b. The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 6A) and an upper processing position (indicated by dashed line 14 in FIG. 6A), which is closely adjacent to the manifold 11. A centerboard (not shown) includes sensors for providing information on the position of the wafers.

Deposition and carrier gases are introduced into the chamber 15 through perforated holes 13b of a conventional flat, circular gas distribution faceplate 13a. More specifically, deposition process gases flow into the chamber through the inlet manifold 11, through a conventional perforated blocker plate and then through holes 13b in gas distribution faceplate 13a.

Before reaching the manifold 11, deposition and carrier gases are input from gas sources through gas supply lines into a mixing system where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360.degree. circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor 32 (FIG. 6A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines, gas delivery system, throttle valve, RF power supply, and chamber and substrate heating systems are all controlled by a system controller over control lines, of which only some are shown. Controller relies on feedback from optical sensors to determine the position of movable mechanical assemblies such as the throttle valve and susceptor which are moved by appropriate motors under the control of controller.

In the exemplary embodiment, the system controller includes a hard disk drive (memory), a floppy disk drive and a processor. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller controls all of the activities of the CVD machine. The system controller executes system control software, which is a computer program stored in a computer-readable medium such as a memory. Preferably, the memory is a hard disk drive, but the memory may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller.

A process for depositing a film on a substrate or a process for cleaning the chamber 15 can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 6B:
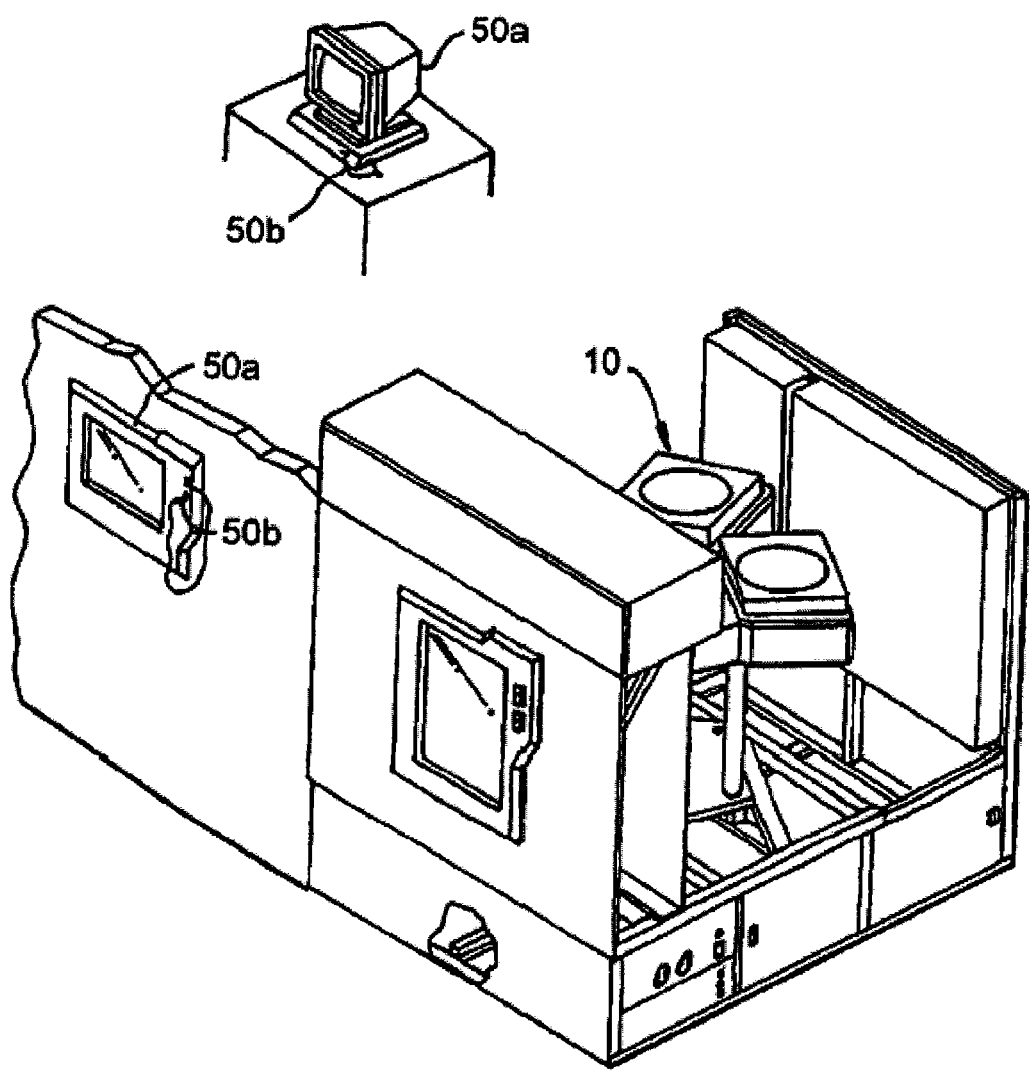
FIG. 6B shows a simplified diagram of a system monitor/controller component of a substrate processing system according to embodiments of the invention.

The interface between a user and the controller is via a CRT monitor 50a and light pen 50b, shown in FIG. 6B, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller.

FIG. 6A shows a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 6A. The adaptor 64 is typically made of metal. A mixing device 70 is coupled to the upstream side of the gas distribution manifold 11 (FIG. 6A). The mixing device 70 includes a mixing insert 72 disposed inside a slot of a mixing block for mixing process gases. A ceramic isolator 66 is placed between the mounting adaptor 64 and the mixing device 70 (FIG. 6A). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. A three-way valve controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of depositing a dielectric layer in a gap formed on a substrate, the method comprising:
   introducing an organo-silicon precursor and an oxygen precursor to a deposition chamber, wherein the organo-silicon precursor has a C:Si atom ratio of less than 8, and wherein the oxygen precursor comprises atomic oxygen that is generated outside the deposition chamber; and
   reacting the organo-silicon precursor and the oxygen precursor to form the dielectric layer in the gap.

2. The method of claim 1, wherein the organo-silicon precursor has an O:Si ratio of greater than 3.

3. The method of claim 1, wherein the organo-silicon precursor has an O:Si ratio of greater than 4.

4. The method of claim 1, wherein the organo-silicon precursor comprises a Si—O—Si bond.

5. The method of claim 1, wherein the organo-silicon precursor comprises a siloxane.

6. The method of claim 5, wherein the siloxane is selected from the group consisting of triethoxysiloxane, tetramethoxysiloxane, trimethoxysiloxane, hexamethoxydisiloxane, octamethoxytrisiloxane, and octamethoxydodecasiloxane.

7. The method of claim 1, wherein the organo-silicon precursor comprises a silazoxane.

8. The method of claim 7, wherein the silazoxane is selected from the group consisting of hexamethoxydisilazoxane, methyl hexamethoxydisilazoxane, chlorohexamethoxydisilazoxane, hexaethoxydislazoxane, octamethoxycyclicsilazoxane, and nonamethoxytrisilazoxane.

9. The method of claim 1, wherein the organo-silicon precursor comprises a halogenated siloxane.

10. The method of claim 9, wherein the halogenated siloxane is selected from the group consisting of tetrachlorosilane, dichlorodiethoxysiloxane, chlorotriethoxysiloxane, hexachlorodisiloxane, and octachlorotrisiloxane.

11. The method of claim 1, wherein the organo-silicon precursor comprises an aminosilane, an alkyl disilane, an alkoxy disilane, an alkoxy-alkyl disilane, an alkoxy-acetoxy disilane, or a cyclosilane.

12. The method of claim 1, wherein the oxygen precursor further comprises molecular oxygen, ozone, water, hydrogen peroxide, or nitrogen dioxide.

13. The method of claim 1, wherein the atomic oxygen is formed by:
    forming a plasma form a gas mixture comprising argon; and
    introducing an oxygen source to the plasma, wherein the oxygen source dissociates to form the atomic oxygen.

14. The method of claim 13, wherein the oxygen source comprises molecular oxygen, ozone or nitrogen dioxide.

15. The method of claim 1, wherein the method further comprises forming a plasma in the deposition chamber from the organo-silicion and oxygen precursors.

16. The method of claim 1, wherein the method further comprises etching the dielectric layer to reduce the carbon content in the layer.

17. The method of claim 1, wherein the method further comprises annealing the dielectric layer in the gap.

18. A method of filling a gap with a dielectric material, the method comprising:
    providing an organo-silicon precursor and an oxygen precursor to a deposition chamber, wherein the organo-silicon precursor has a C:Si atom ratio of less than 8;
    generating a plasma from the organo-silicon precursor and the oxygen precursor in the deposition chamber, wherein the plasma deposits a first portion of the dielectric material in the gap;
    etching the first portion of the dielectric material to reduce the carbon content in the material;
    depositing a second portion of the dielectric material in the gap; and
    annealing the first and second portions of the dielectric material in the gap.

19. The method of claim 18, wherein the organo-silicon precursor has a C:Si ratio of about 6 or less.

20. The method of claim 18, wherein the organo-silicon precursor has an O:Si ratio of about 3 or more.

21. The method of claim 18, wherein the organo-silicon precursor comprises a Si—O—Si bond.

22. The method of claim 18, wherein the organo-silicon precursor comprises a silazoxane.

23. The method of claim 22, wherein the method comprises oxidizing a Si—N bond in the silazoxane and forming a Si—O bond.

24. The method of claim 23, wherein the Si—N bond is oxidized with a remotely generated atomic oxygen precursor.

25. The method of claim 18, wherein the organo-silicon precursor comprises a halogenated siloxane.

26. The method of claim 25, wherein the method comprises oxidizing a Si—X bond in the halogenated siloxane and forming a Si—O bond, wherein X is a halogen atom.

27. The method of claim 18, wherein the method comprises etching the second portion of the dielectric material before the annealing.

28. The method of claim 18, wherein the oxygen precursor comprises atomic oxygen that is generated outside the deposition chamber.

29. A method of depositing and annealing a dielectric material in a gap on a substrate, the method comprising:
    providing an organo-silicon precursor and an oxygen precursor to a deposition chamber, wherein the organo-silicon precursor has a C:Si atom ratio of less than 8;
    reacting the organo-silicon precursor and the oxygen precursor to deposit the dielectric material in the gap;
    performing a thermal anneal on the deposited dielectric material; and
    performing a plasma anneal on the deposited dielectric material.

30. The method of claim 29, wherein the thermal anneal comprises heating the dielectric material to a temperature of about 300° C. to about 600° C. for about 1 minute to about 30 minutes.

31. The method of claim 29, wherein the plasma anneal comprises exposing the dielectric material to a high-density plasma for about 1 minute to about 10 minutes.

32. The method of claim 29, wherein the organo-silicon precursor has a C:Si ratio of about 6 or less.

33. The method of claim 29, wherein the organo-silicon precursor has an O:Si ratio of about 3 or more.

34. The method of claim 29, wherein the organo-silicon precursor comprises a Si—O—Si bond.

35. The method of claim 29, wherein the organo-silicon precursor comprises a siloxane.

36. The method of claim 29, wherein the organo-silicon precursor comprises a silazoxane or a halogenated siloxane.

37. The method of claim 29, wherein the oxygen precursor comprises atomic oxygen that is generated outside the deposition chamber.

* * * * *

UNITED STATES PATENT AND TRADEMARK OFFICE
CERTIFICATE OF CORRECTION

PATENT NO. : 7,498,273 B2  Page 1 of 1
APPLICATION NO. : 11/549930
DATED : March 3, 2009
INVENTOR(S) : Abhijit Basu Mallick et al.

It is certified that error appears in the above-identified patent and that said Letters Patent is hereby corrected as shown below:

Column 18, line 27, delete "deposite" and insert --deposit--

Signed and Sealed this

Twenty-second Day of September, 2009

David J. Kappos
*Director of the United States Patent and Trademark Office*